United States Patent
Gebhardt

(10) Patent No.: US 6,618,611 B2
(45) Date of Patent: Sep. 9, 2003

(54) MAGNETIC RESONANCE APPARATUS WITH A COIL SYSTEM OPTIMIZED FOR NOISE REDUCTION AND METHOD FOR DESIGNING THE COIL SYSTEM

(75) Inventor: Matthias Gebhardt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/799,262

(22) Filed: Mar. 5, 2001

(65) Prior Publication Data

US 2001/0027264 A1 Oct. 4, 2001

(30) Foreign Application Priority Data

Mar. 7, 2000 (DE) .......................... 100 11 034

(51) Int. Cl.[7] .................................. A61B 5/05
(52) U.S. Cl. ....................... 600/422; 324/318
(58) Field of Search .................. 600/422, 421, 600/425; 324/318, 319, 322, 307, 309

(56) References Cited

U.S. PATENT DOCUMENTS 5,309,107 A     5/1994  Pausch
5,698,980 A  *  12/1997 Sellers et al. ................ 324/318
5,952,829 A  *  9/1999  Melcher et al. ............. 324/318
6,407,548 B1 *  6/2002  Dietz ........................... 324/307
6,437,568 B1 *  8/2002  Edelstein et al. ........... 324/318

FOREIGN PATENT DOCUMENTS

DE          197 26 332          12/1998

* cited by examiner

Primary Examiner—Quang T. Van
(74) Attorney, Agent, or Firm—Schiff Hardin & Waite

(57) ABSTRACT

A magnetic resonance apparatus has a basic field magnet system for generating a basic magnetic field and a coil system with a coil arrangement, wherein a course of a current-carrying conductor of the coil arrangement for generating a predetermined target magnetic field is determined according to a method that allows for linear secondary conditions. A noise-causing mechanical oscillation of the coil system as a result of Lorentz forces that act on the current-carrying conductor in the basic magnetic field is thereby taken into consideration by one of the linear secondary conditions, and the course of the conductor is additionally determined by the method so that the noise-causing oscillation is diminished.

9 Claims, 3 Drawing Sheets

MAGNETIC RESONANCE APPARATUS WITH A COIL SYSTEM OPTIMIZED FOR NOISE REDUCTION AND METHOD FOR DESIGNING THE COIL SYSTEM

BACKGROUND OF THE INVENTION

1. Field of the Invention

The present invention is directed to a magnetic resonance apparatus of the type having a basic field magnet system for generating a basic magnetic field and a gradient coil system with a coil arrangement, wherein the curvature of a conductor of the coil arrangement with current flowing therein is set for generating a predetermined target magnetic field using a method that takes linear secondary conditions into consideration.

2. Description of the Prior Art

Magnetic resonance tomography is a known technique for generating images of the internal body of an examination subject. To that end, in a magnetic resonance tomography apparatus rapidly switched gradient fields are superimposed on a static basic magnetic field that is generated by a basic field magnet system, the gradient fields being generated by a gradient coil system composed of primary and secondary coils. Further, the gradient coil system often includes shim coils with which the homogeneity of the basic magnetic field can be improved. Further, the magnetic resonance tomography apparatus has a radio-frequency system that emits radio-frequency signals into the examination subject for triggering magnetic resonance signals. The radio-frequency system also registers the generated magnetic resonance signals from which magnetic resonance images are produced.

For generating gradient fields, suitable, predetermined currents are supplied to the gradient coils. The current rise and decay rates amount to several 100 kA/s. Given an existing basic magnetic field on the order of magnitude of 1 T, Lorentz forces that lead to oscillations of the gradient coil system act on these time-variable currents in the gradient coils. These oscillations are transmitted to the surface of the apparatus via various propagation paths. The surface converts these mechanical oscillations into acoustic oscillations that ultimately lead to inherently unwanted noise.

An analysis of the aforementioned oscillations can be based, for example, on the natural resonant behavior of the gradient coil system. The natural resonance behavior is defined by the eigenfrequencies and the eigenfrequency modes. The effect of the Lorentz forces on the eigenfrequency modes is described in the form of participation factors. These indicate the extent to which the Lorentz forces excite a specific eigenfrequency mode. Given knowledge of the participation factors and the eigenfrequencies, the oscillation of the gradient coil system can be defined for every location and for each frequency for superimposing the oscillations of the natural resonant modes.

German OS 42 03 582, corresponding to U.S. Pat. No. 5,309,107, discloses a transverse gradient coil wherein the coil conductors are arranged on a carrier and proceed on paths whose attachment points are defined in that a grid mesh network of elementary coils is placed over the carrier, the magnetic field produced by each elementary coil is calculated, and a number of Ampere turns is defined with a fit algorithm on the basis of a prescribable target field distribution for every elementary coil. Discrete conductor positions that serve as attachment points for the paths of the coil conductors are determined by integration. By introducing physical boundary conditions, a reduction in noise can thereby be achieved by minimizing global bending forces and an optimization of the mechanical oscillatory behavior can be achieved by minimizing reaction forces between the gradient coil and a basic field magnet system. To this end, a field component of the gradient coil that is critical for producing the Lorentz forces is minimized at the location of the basic field magnet system on the basis of a suitable boundary condition.

Further, German OS 197 26 332 discloses a coil arrangement that generates a predetermined target magnetic field wherein a specific number of constituent points in that current-carrying conductors in a layer of the coil arrangement proceed on paths whose supporting points are identified according to the following method:

For designing a coil arrangement, a layer in which conductors of the coil arrangement should proceed is first divided into a number of elementary surfaces adjoining one another. The aforementioned elementary surfaces are referred to in brief below as meshes. As a result of the classification, a network of meshes arises. The individual meshes, for example, are consecutively numbered for a hollow-cylindrical coil system according to FIG. 2, being numbered from 1 through $\tilde{N}$. Thus, $j=1 \ldots N \ldots N$ is valid for an appertaining running variable j.

Each of the aforementioned meshes can be considered as being surrounded by a conductor, so that a number of elementary coils conceptually arises, each being respectively composed of a closed winding. The current distribution on the entire conductor structure in the optimization is interpreted as the superimposition of closed, elementary circuits in the elementary coils. These are referred to below as mesh currents.

Further, a target magnetic field column vector $\underline{z}$ (gradient field or shim characteristic) is predetermined in a number M of constituent points $P_i$. The number M of constituent points is greater than the number $\tilde{N}$ of meshes. The appertaining running variable, with i is $i=1 \ldots M$. The target magnetic field column vector $\underline{z}$, which contains a number M of target fields $z_1$ through $Z_M$ in the constituent points $P_1$ through $P_M$, normally contains constituent points on a surface of a sphere and constituent points on eddy current surfaces. The target magnetic field should be zero for the latter.

A unit current is considered as flowing in each of the $\tilde{N}$ elementary coils. A magnetic field contribution $f_{ij}$ in each of the M constituent points that is generated by the appertaining unit current is thus obtained for each mesh. The contribution $f_{ij}$ is thus the magnetic field contribution of a unit current in the $j^{th}$ mesh in the $i^{th}$ constituent point. The following magnetic field column vector $\underline{b}$ with the elements $b_1$ through $b_M$ is obtained for a mesh current column vector $\underline{i}$ having the elements $i_1$ through $i_{\tilde{N}}$:

$$\underline{b} = \begin{bmatrix} b_1 \\ \vdots \\ b_M \end{bmatrix} = F \cdot \underline{i} = \begin{bmatrix} f_{11} & \cdots & f_{1\tilde{N}} \\ \vdots & \ddots & \vdots \\ f_{M1} & \cdots & f_{M\tilde{N}} \end{bmatrix} \cdot \begin{bmatrix} i_1 \\ \vdots \\ i_{\tilde{N}} \end{bmatrix}$$

or, presented differently:

$$b_i = \sum_{j=1}^{\tilde{N}} f_{ij} \cdot i_j.$$

A deviation of the magnetic field column vector $\underline{b}$ from the target magnetic field column vector $\underline{z}$ derives from:

$$\sum_i (b_i - z_i)^2.$$

A goal of an optimization is always a minimization of the aforementioned deviation. As disclosed in the aforementioned published German application, additional expressions to be minimized, for example the magnetic field energy multiplied by a weighting factor can thereby be added to the deviation, and, given employment of the described optimization algorithms, additional, linear secondary conditions having the form $$|A \cdot i| = \begin{bmatrix} a_{11} & \cdots & a_{i\tilde{N}} \\ \vdots & \ddots & \vdots \\ a_{\mu 1} & \cdots & a_{\mu\tilde{N}} \end{bmatrix} \cdot \begin{bmatrix} f_{11} \\ \vdots \\ f_{MI} \end{bmatrix} \le \begin{bmatrix} u_1 \\ \vdots \\ u_{\mu 1} \end{bmatrix} = \underline{u}$$

are made, wherein $\underline{u}$ is a prescribable limit column vector having the elements $u_1$ through $u_\mu$, and $\underline{A}$ is a prescribable matrix having the elements $a_{11}$ through $a_{\mu\tilde{N}}$ for defining relations appertaining to the mesh currents. Examples thereof are described in the aforementioned published application.

The current distribution determined in this manner, i.e. the mesh current column vector $\underline{i}$, is simulated with discrete conductors that are permeated by a constant rated current. Techniques for this are disclosed in the aforementioned published application.

Given the coil arrangement disclosed in the aforementioned published application, a disadvantage, among other things, is that factors regarding noise reduction do not enter into the design.

SUMMARY OF THE INVENTION

It is an object of the present invention to provide a magnetic resonance apparatus of the type initially described wherein the aforementioned disadvantages are avoided.

The above object is achieved in accordance with the principles of the present invention in a magnetic resonance apparatus of the type described above, and a method for designing a gradient coil system for a magnetic resonance apparatus, wherein the course or path of a current-carrying conductor of the coil arrangement for generating a predetermined target magnetic field is determined according to a method that allows linear secondary conditions to be taken into consideration, and wherein a noise-causing mechanical oscillation of the coil system, resulting from Lorentz forces acting on the current-carrying conductor in the basic magnetic field, is taken into consideration by one of the aforementioned linear secondary conditions, and the determination of the course or path of the current-carrying conductor is augmented so that the noise-causing oscillation is reduced.

Because one of the linear secondary conditions takes into account a noise-causing, mechanical oscillation of the coil system as a consequence of Lorentz forces that act on the current-permeated conductor in the basic magnetic field, the course of the conductor is additionally defined by the method so that the noise-causing oscillation is reduced. Thus, a noise-optimized coil system can be planned from the design outset without iterative intermediate steps.

In an embodiment, the oscillation to be diminished is at least one natural resonant mode of the coil system. Particularly given excitation of a dominant resonant mode, especially bothersome noise occurs as a consequence of the Lorentz forces, and therefore if this dominant mode is suppressed by the inventive method and apparatus, a significant noise reduction is achieved.

In another embodiment, the coil system is hollow-cylindrically fashioned, and the oscillation to be diminished has a component that is directed radially relative to a principal axis of the hollow cylinder. Since, given a hollow-cylindrical coil system, it is particularly the movements acting radially relative to the principal cylinder axis that are relevant to the noise, a high noise-reducing effect is thereby achieved given a simultaneous simplification of the method.

In a further embodiment, the method is a quadratic optimization containing a quadratic target function. As a result thereof, the method can be implemented in an especially advantageous way on a computer system in a forward calculation without iterative procedures.

DESCRIPTION OF THE PREFERRED EMBODIMENTS

Figure 1:
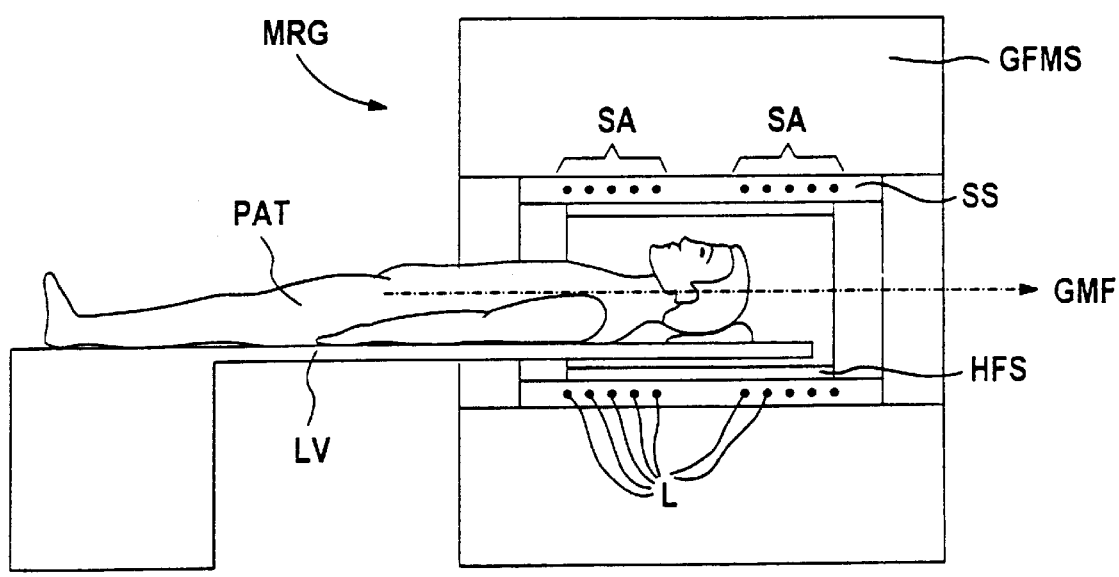
FIG. 1 is a cross-section through a magnetic resonance apparatus having a hollow-cylindrical coil system, for explaining the invention.

FIG. 1 shows a cross-section through a magnetic resonance apparatus MRG having a hollow-cylindrical coil system SS. The magnetic resonance apparatus MRG also has a basic field magnet system GFMS for generating a basic magnetic field in GMF. The coil system SS, for example, includes gradient coil arrangements for generating gradient fields as well as shim coil arrangements with which the homogeneity of the basic magnetic field GMF can be improved. As an example, cross-sections of a conductor L of the coil arrangement SL are shown at the section planes of the coil system SS for one of the aforementioned coil arrangements SA. The magnetic resonance apparatus MRG also has a radio-frequency system HFS that emits radio-frequency signals into an examination subject, for example a patient PAT, for triggering magnetic resonance signals and that picks up the generated magnetic resonance signals. The apparatus MRG also has a bearing device LV on which the patient PAT is seated.

Figure 2:
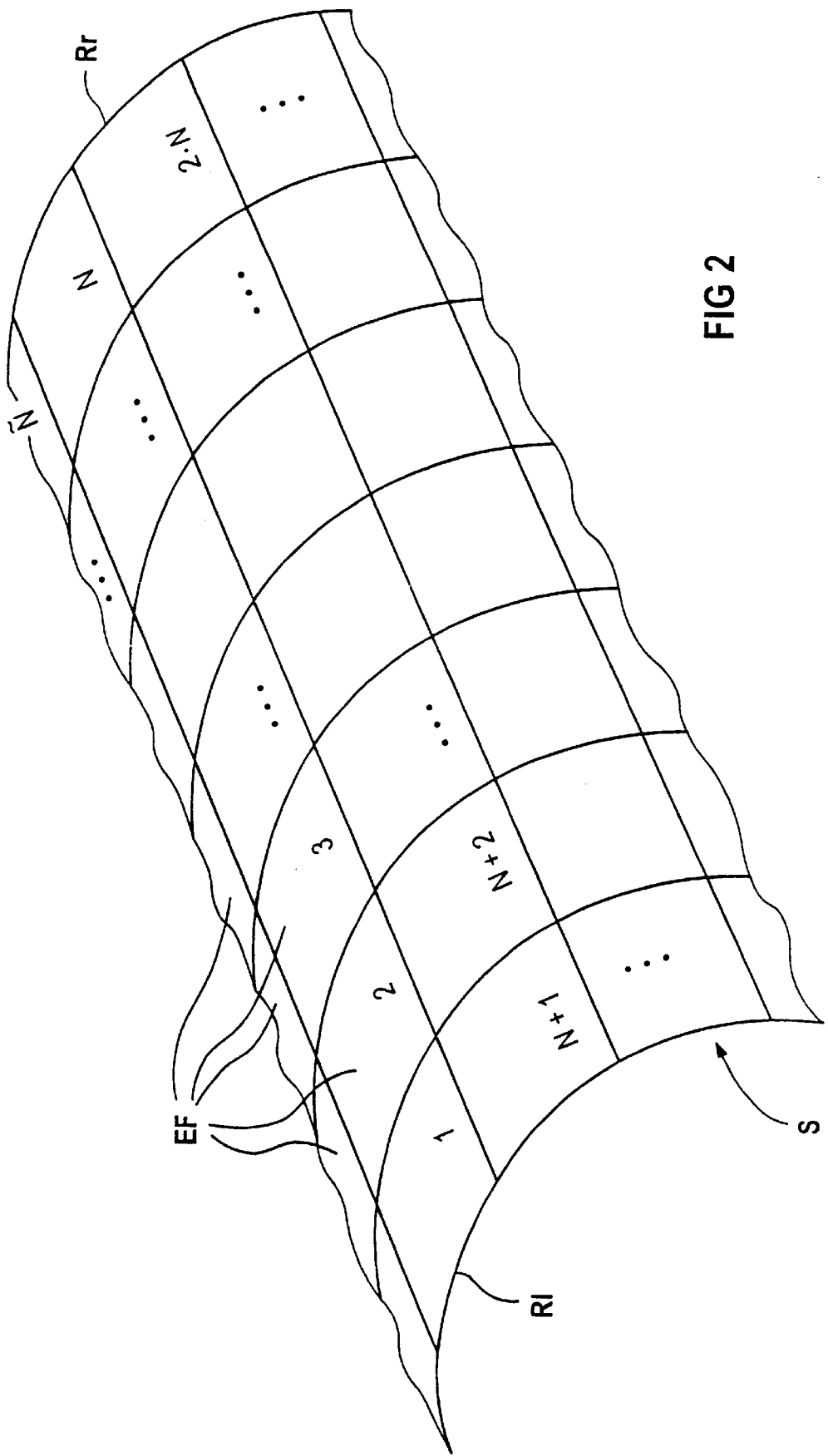
FIG. 2 shows a consecutive numbering of meshes within a layer of a hollow-cylindrical coil system for explaining the invention.

FIG. 2 shows an excerpt from a circular cylindrical layer S of the hollow-cylindrical coil system SS of the magnetic resonance apparatus MRG in which a conductor L of the coil arrangement SA should proceed. The layer S is subdivided into identical meshes EF. The consecutive numbering of the meshes EF thereby begins at a mesh EF having the number 1 at the edge R1 of the layer S and proceeds parallel to the principal cylinder axis up to the edge Rr lying opposite. The aforementioned meshes EF are consecutively numbered from 1 through N. A skip subsequently ensues into a mixed line of meshes EF. These are again consecutively numbered from N+1 through 2·N. This continues up to a mesh EF having the number $\tilde{N}$.

Figure 3:
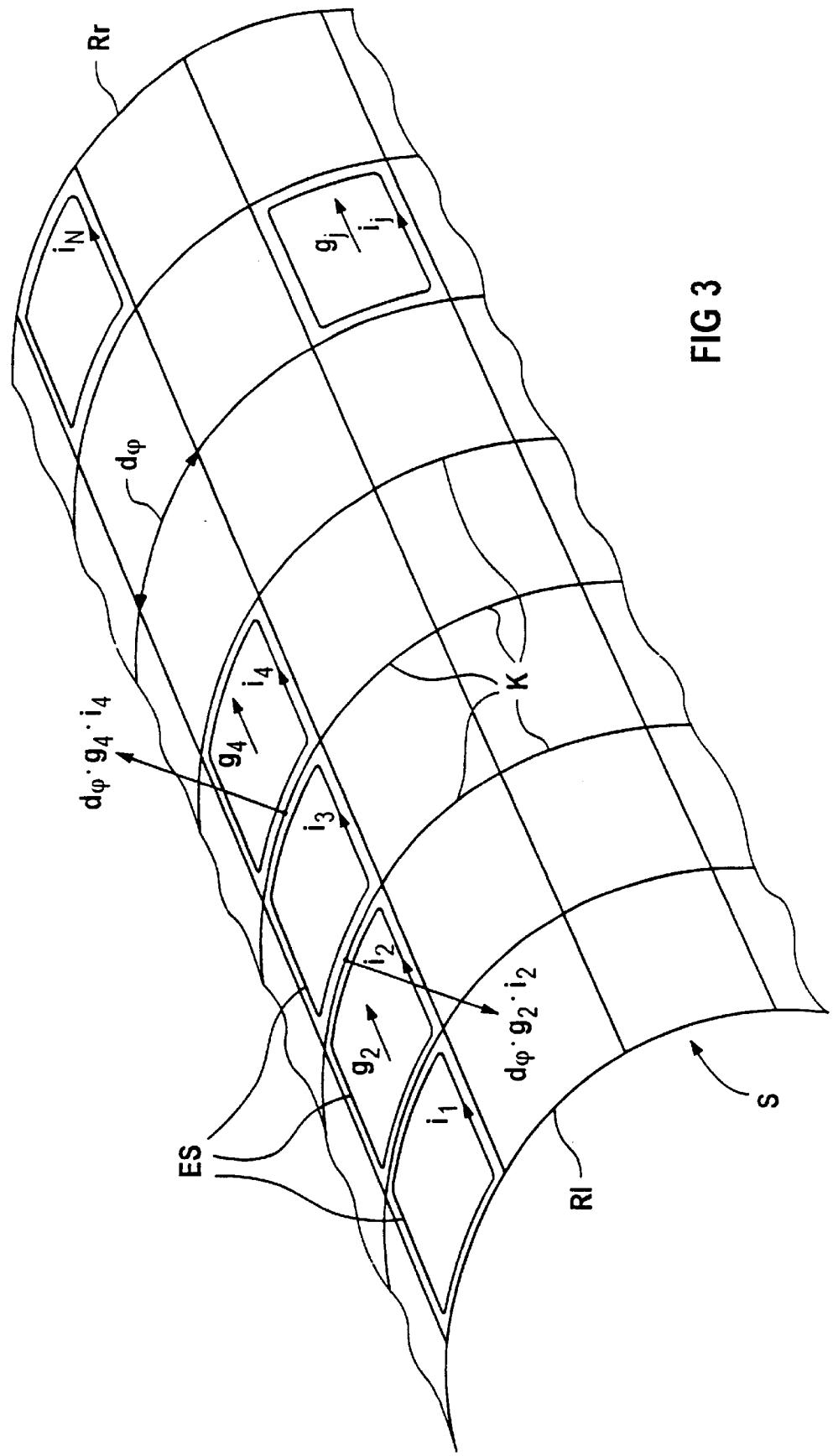
FIG. 3 shows the layer from FIG. 2 divided into meshes with elementary coils and mesh currents.

For explaining the invention, FIG. 3 shows an excerpt, as an example, from a slice S divided into meshes EF in the hollow-cylindrical coil system SS of the magnetic resonance apparatus MRG having elementary coils ES and mesh currents $i_j$. The same division of the layer S into meshes EF having the same numbering as in FIG. 2 is thereby employed. The point of departure from the method disclosed in German OS 197 26 332.

Lorentz forces are the cause of a noise-producing oscillation of the coil system SS. These Lorentz forces—given an existing basic magnetic field GMF penetrating the coil system SS—act on a current distribution that is defined by a course of a current-carrying conductor L of the coil arrangement SA. The course is to be defined such that both a predetermined target magnetic field $\underline{z}$ can be generated and the noise-causing oscillation is diminished.

To that end, the current distribution to be defined within the layer S is quite generally described by local current components and the basic magnetic field GMF is described by local basic magnetic field components in a three-dimensional embodiment. Local Lorentz forces then result from a cross-product formation between one of the local current components and one of the local basic magnetic field components. For reasons of a simple presentation, only local current components in the circumferential direction shall be considered below, and the basic magnetic field GMF is assumed to be co-linear with the principal cylinder axis, so that a simple product of two scalar quantities replaces the aforementioned cross-product of two vector quantities.

When the current distribution is rendered discrete in mesh currents $i_j$, the aforementioned local current components are established by a difference between mesh currents $i_j$ of neighboring meshes EF and, specifically, the local current components in circumferential direction are established by mesh current differences between neighboring meshes in the direction of the principal cylinder axis. A local Lorentz force acting on the mid-point of a mesh EF derives from the fractional sum of the forces at its edges K in the circumferential direction. Let the aforementioned edge K of a mesh EF thereby have a dimension $d_\varphi$ in the circumferential direction that can be mesh-dependent in the general case. Since each edge K is to be divided onto two neighboring meshes EF with respect to the direction of the principal cylinder axis, the aforementioned forces participate by halves at the edges K.

In the model of the meshes EF, a natural resonant mode of the coil system SS, for example in the form of amplitudes radially directed from a center of the respective mesh EF, is described in the form of a column vector $\underline{c}$ with the elements $c_1$ through $c_{\tilde{N}}$ dependent on forces acting at the coil system SS. Given hollow-cylindrical coil systems SS, the aforementioned radially directed amplitudes are the principal cause for the creation of noise in practice. The aforementioned limitation to radially directed amplitudes, as noted above, does not ensue due to a fundamental limitation of the method but for reasons of a simple presentation. In general form, a three-dimensional motion possibility of the meshes EF is to be considered for describing one of the natural resonant modes.

In the division into meshes EF, the size of the meshes EF is to be selected such that the natural resonant modes to be limited, as well as inhomogeneities of the basic magnetic field GMF are rendered discrete with an adequately small error of, typically, 1%.

For reasons of a simple presentation, only the first line of meshes EF is considered below for j=1 . . . N. The same applies to the other lines. In order to save separate considerations for the meshes EF at the edges R1 and $R_r$ having the numbers j=1 and j=N, it is assumed that, for example, these already lie outside the coil arrangement SA, i.e. carry a mesh current $i_j$ equal to zero.

Below, $g_j$ is the local component of the basic magnetic field GMF in the center of the small $j^{th}$ mesh EF. The components $g_j$ of the basic magnetic field GMF thereby comprise a direction corresponding to the principal cylinder axis. The values of $g_j$ can be different from mesh EF to mesh EF, for example as a consequence of field-distorting effect of the coil system SS. The following thus derives for the aforementioned, radially directed, local Lorentz force $k_j$ acting on the $j^{th}$ mesh:

$$k_j = \frac{1}{2} \cdot d_\varphi \cdot (g_{j+1} \cdot i_{j+1} - g_{j-1} \cdot i_{j-1}) \text{ for } j = 2 \ldots N - 1.$$

One proceeds analogously for general numberings of meshes and arbitrary geometries of coil arrangements, particularly for considerations that include a generally three-dimensional presentation of all quantities. Instead of neighboring indices j−1 and j+1, the calculations are carried out in generalized form with mesh-dependent neighborhood lists.

The requirement that the natural resonant mode described by the elements $c_j$ of the column vector $\underline{c}$ is not excited, or is excited to only a limited extent, by a Lorentz force distribution described by the local Lorentz forces $k_j$ is expressed by the following orthogonality relationship:

$$\sum_{j=1}^{\tilde{N}} c_j \cdot k_j \leq u,$$

or, presented differently:

$$\frac{1}{2} \cdot d_\varphi \cdot \sum_{j=2}^{N-1} (c_j(g_{j+1} \cdot i_{j+1} - g_{j-1} \cdot i_{j-1})) \leq u.$$

In the above, u is a prescribable limit value. In the general three-dimensional case, a scalar product of two vector quantities replaces the simple multiplication between the components $c_j$ and $k_j$.

For taking the noise reduction in the linear secondary conditions into consideration, for example, the initially described matrix $\underline{A}$ is augmented by the following line having the elements $a_1$ through $a_{\tilde{N}}$ and the limit column vector $\underline{u}$ is to be augmented by a value $\tilde{u}$:

$$\left| \sum_{j=1}^{\tilde{N}} a_j \cdot i_j \right| \leq \tilde{u}.$$

Then applying to the coefficients $a_1$ through $a_N$ for the above-described example with the exemplary consideration of the meshes EF having the numbers 1 through N is:

$$a_2 = -\frac{1}{2} \cdot d_\varphi \cdot g_2 \cdot c_3, \qquad a_{N-1} = \frac{1}{2} \cdot d_\varphi \cdot g_{N-1} \cdot c_{N-2} \text{ and}$$

$$a_j = \frac{1}{2} \cdot d_\varphi \cdot g_j(c_{j-1} - c_{j+1}) \text{ for } j = 3, \ldots, N - 2.$$

The coefficients $a_1$ and $a_N$ need not be discussed since they are zero by definition since they are incident onto the respective mesh currents $i_1$ and $i_N$ in the multiplication.

Taking the aforementioned, linear secondary condition into consideration, finally, a course of the conductor L of the coil arrangement SA that is noise-optimized with respect to the natural resonant modes under consideration can be determined according to the initially described method.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:

a basic field magnet system for generating a basic magnetic field;

a coil system having a coil arrangement with at least one current-carrying conductor said coil system being subject to mechanical oscillations resulting from Lorentz forces acting on said current-carrying conductor in said basic magnetic field; and said at least one current-carrying conductor following a path for simultaneously generating a predetermined target magnetic field and for reducing at least one of said mechanical oscillations which is a mechanical oscillation which contributes to said noise.

2. A magnetic resonance apparatus as claimed in claim 1 wherein said coil system has a natural resonant mode which is one of said mechanical oscillations, and wherein said at least one current-carrying conductor has a path for simultaneously generating said predetermined target magnetic field and for reducing excitation of said natural resonant mode.

3. A magnetic resonance apparatus as claimed in claim 1 wherein said coil system is a hollow-cylindrical coil system, and wherein said at least one current-carrying conductor has a path for simultaneously generating said predetermined target magnetic field and for reducing one of said mechanical oscillations having a component directed radially relative to a principal axis of said hollow-cylindrical coil system.

4. A method for designing a gradient coil system for a magnetic resonance apparatus, said magnetic resonance apparatus having a basic field magnet system for generating a basic magnetic field and said coil system having a coil arrangement with a layer in which a current-carrying conductor, following a path in said layer, is disposed, and wherein said coil system is subject to mechanical oscillations resulting from Lorentz forces acting on said current-carrying conductor in said basic magnetic field, said method comprising the steps of:

determining said path of said current-carrying conductor in said layer for generating a predetermined target magnetic field using a calculation procedure which encompasses linear secondary conditions;

identifying at least one of said mechanical oscillations which is a noise-causing mechanical oscillation and representing said noise-causing mechanical oscillation as one of said linear secondary conditions which is encompassed in said calculation procedure; and determining said path of said current-carrying conductor in said layer using said calculation procedure to simultaneously generate said predetermined target magnetic field and to reduce said noise-causing mechanical oscillation.

5. A method as claimed in claim 4 comprising employing a quadratic optimization procedure as said calculation procedure, containing a quadratic target function.

6. A method as claimed in claim 5 wherein said calculation procedure comprises the steps of:

dividing said layer of said coil arrangement into a network of meshes;

occupying each mesh in said network with an elementary coil formed by a closed winding carrying a mesh current;

identifying a magnetic field contribution to said target magnetic field generated by each mesh current, said quadratic target function comprising said mesh currents in said network, the respective magnetic field contributions of said mesh currents, and said target magnetic field;

minimizing said quadratic target function relative to said target magnetic field; and determining said path of said current-carrying conductor dependent on the mesh currents which minimize said quadratic target function.

7. A method as claimed in claim 6 wherein said noise-causing mechanical oscillation is a natural resonant mode of said coil system, and wherein said method further comprises the steps of:

for each mesh, identifying a location dependency relative to one of said meshes subjected to said natural resonant mode;

for each mesh, identifying a Lorentz force acting on one of said meshes;

for each mesh, forming a scalar product of said location dependency and said Lorentz force;

summing the respective scalar products for all of said meshes to form a summation result; and forming said one of said linear secondary conditions by setting said summation result to be less than a predetermined value.

8. A method as claimed in claim 7 wherein the step of determining the Lorentz force for each of said meshes comprises identifying mesh currents of neighboring meshes and values of said basic magnetic field for each of said neighboring meshes, and calculating said Lorentz force from said mesh currents of said neighboring meshes and said values of said basic magnetic field in said neighboring meshes.

9. A method as claimed in claim 7 wherein the step of determining the Lorentz force in each of said meshes includes identifying an edge length of each of said meshes, and employing said edge length for calculating said Lorentz force.

* * * * *